US006674303B1

(12) United States Patent
Morse et al.

(10) Patent No.: US 6,674,303 B1
(45) Date of Patent: Jan. 6, 2004

(54) PROGRAMMABLE INPUT/OUTPUT CELL WITH BIDIRECTIONAL AND SHIFT REGISTER CAPABILITIES

(75) Inventors: Douglas C. Morse, Yamhill, OR (US); Clement Lee, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 44 days.

(21) Appl. No.: 10/017,725

(22) Filed: Dec. 14, 2001

(51) Int. Cl.[7] .............................................. H03K 19/177
(52) U.S. Cl. ............................. 326/41; 326/37; 326/38; 326/47
(58) Field of Search ....................................... 326/37–41

(56) References Cited

U.S. PATENT DOCUMENTS 5,644,496 A * 7/1997 Agrawal et al. ............ 364/489
5,760,719 A * 6/1998 Graf ........................... 341/100
5,944,813 A * 8/1999 Trimberger ................. 712/36

* cited by examiner

Primary Examiner—Anh Tran
(74) Attorney, Agent, or Firm—MacPherson Kwok Chen & Heid LLP

(57) ABSTRACT

An input/output (I/O) circuit or cell associated with a pin of a programmable logic circuit allows the pin to be configured as for bidirectional input and output operations, without requiring a second one-bit register to be configured from the configurable logic elements of the programmable logic circuit. The I/O cell can be used in parallel-to-serial, serial-to-parallel and shift register operations.

16 Claims, 4 Drawing Sheets

| DESCRIPTION I/O MODE | MUX SETTINGS | | | | | | |
|---|---|---|---|---|---|---|---|
| | A | B | C | D | E | F | G |
| INPUT | XX | XX | XX | 1 | 00 | X | 10 |
| OUTPUT | XX | 0V | 0V | X | XX | 0 | 11 |
| BI-DIRECTIONAL | XX | 0V | 0V | 1 | 00 | 0 | 00 |
| REGISTERED OUTPUT | 01 | 0V | 1V | X | XX | 0 | 11 |
| REGISTERED INPUT | XX | XX | XX | 1 | 10 | X | 10 |
| REGISTERED INPUT BI-DIRECTIONAL | XX | 0V | 0V | 1 | 10 | 0 | 00 |
| REGISTERED OUTPUT BI-DIRECTIONAL | 01 | 0V | 1V | 1 | 00 | 0 | 00 |
| REGISTERED OUTPUT BI-DIRECTIONAL w/REGISTERED OE | 01 | 1V | 1V | 1 | 00 | 0 | 00 |
| REGISTERED OUTPUT AND INPUT BI-DIRECTIONAL | 01 | 0V | 1V | 1 | 10 | 0 | 00 |
| REGISTERED OUTPUT AND INPUT BI-DIRECTIONAL w/REGISTERED | 01 | 1V | 1V | 1 | 10 | 0 | 00 |
| SERIAL TO PARRALLEL DOUBLE BUFFERED-SERIAL INPUT CELL | 01 | YY | 11 | 0 | XX | 1 | 11 |
| SERIAL TO PARRALLEL DOUBLE BUFFERED-INTERNAL CELL | 00 | YY | 11 | 0 | XX | 1 | 11 |
| SERIAL TO PARRALLEL DOUBLE BUFFERED-SERIAL OUTPUT CELL | 00 | YY | 11 | 0 | 10 | 1 | 11 |
| PARALLEL TO SERIAL DOUBLE BUFFERED | Z1 | XX | 11 | 1 | 01 | X | 10 |
| SERIAL TO PARRALLEL- SERIAL INPUT CELL | 01 | YY | 11 | X | XX | 0 | 11 |
| SERIAL TO PARRALLEL- INTERNAL CELL | 00 | YY | 11 | X | XX | 0 | 11 |
| SERIAL TO PARRALLEL- SERIAL OUTPUT CELL | 00 | YY | 11 | X | 01 | 0 | 11 |
| PARALLEL TO SERIAL | Z0 | XX | 11 | 1 | 01 | X | 10 |
| PARALLEL TO SERIAL-SERIAL OUTPUT CELL | XX | YY | 01 | X | XX | 0 | 11 |
| SHIFT REGISTER | 00 | YY | 11 | X | XX | X | XX |

NOTE: X=DON'T CARE
NOTE: YY=SET ACCORDING TO OE REQUIREMENTS FOR OUTPUT
NOTE: Z=1 IS A LOAD SHIFT REGISTER 0 IS SHIFT
NOTE: V=SET ACCORDING TO POLARITY REQUIRED

*FIG. 2*

PROGRAMMABLE INPUT/OUTPUT CELL WITH BIDIRECTIONAL AND SHIFT REGISTER CAPABILITIES

BACKGROUND OF THE INVENTION

1. Field of the Invention

The present invention relates to an input/output (I/O) circuit for a programmable logic circuit (e.g., a field programmable gate array or a complex programmable logic device, known to those skilled in the art). In particular, the present invention relates to an I/O circuit with bidirectional input and output, and shift register capabilities.

2. Description of the Related Art

In a programmable logic circuit, the I/O pins of the integrated circuit are each associated with an I/O circuit or cell, which is used to either receive an input signal from the associated pin, or to drive an output signal onto the associated pin. One example of an I/O cell in the prior art is described in U.S. Pat. No. 6,034,541, entitled "In-system Programmable Interconnect Circuit" to Kopec et al., filed on Apr. 7, 1997, issued on Mar. 7, 2000, which is assigned to Lattice Semiconductor Corporation, also the Assignee of the present application. The disclosure of U.S. Pat. No. 6,034,541 is hereby incorporated by reference in its entirety to provide background information.

Typically an I/O cell provides only a single flip-flop which is configurable to either latch the input signal, or to provide a registered output signal. In order to provide bidirectional operations using the I/O circuit, a 1-bit output register is configured from the general-purpose configurable logic circuits in the programmable logic circuit. Not only is this arrangement cumbersome, providing an output register in this manner results in a circuit that does not meet performance requirements typical of many telecommunication or data communication applications.

SUMMARY OF THE INVENTION

An input/output (I/O) circuit or cell associated with a pin of a programmable logic circuit allows the pin to be configured as for bidirectional input and output operations, without requiring a second one-bit register to be configured from the configurable logic elements of the programmable logic circuit. The I/O cell can be used in parallel-to-serial, serial-to-parallel and shift register operations.

In one embodiment of the present invention, the input/output (I/O) circuit includes input and output flip-flops for capturing an input signal and for providing an output signal, respectively, and multiplexers for routing signals between the input and output flip-flops. Additional multiplexers and routing resources can be provided to route the input signal, the output signal and other signals to other portions of the programmable logic circuit and other I/O circuits. In one implementation, the routing resource provides additional input signals, global clocks and other control signals.

By suitably configuring the input flip-flop, the output flip-flop and various multiplexers, the present invention allows a group of I/O circuits to provide serial-to-parallel, parallel-to-serial and shift register operations.

In one embodiment, a control flip-flop is provided in the I/O circuit to provide a registered control signal (e.g., an output enable signal).

By providing input, output and bidirectional operations without calling on configurable logic elements in the programmable logic circuit, the I/O circuits of the present invention meet high performance requirements of telecommunication and data communication applications.

The present invention is better understood upon consideration of the detailed description below and the accompanying drawings.

BRIEF DESCRIPTION OF THE DRAWINGS

FIG. 2 summarizes the values of various control signals into the selection terminals of multiplexers 104–107,118 and 110–111 for each of the operating modes of I/O cell 100.

To facilitate comparison among the figures, like elements in these figures are provided like reference numerals.

DETAILED DESCRIPTION OF THE PREFERRED EMBODIMENTS

Figure 1:
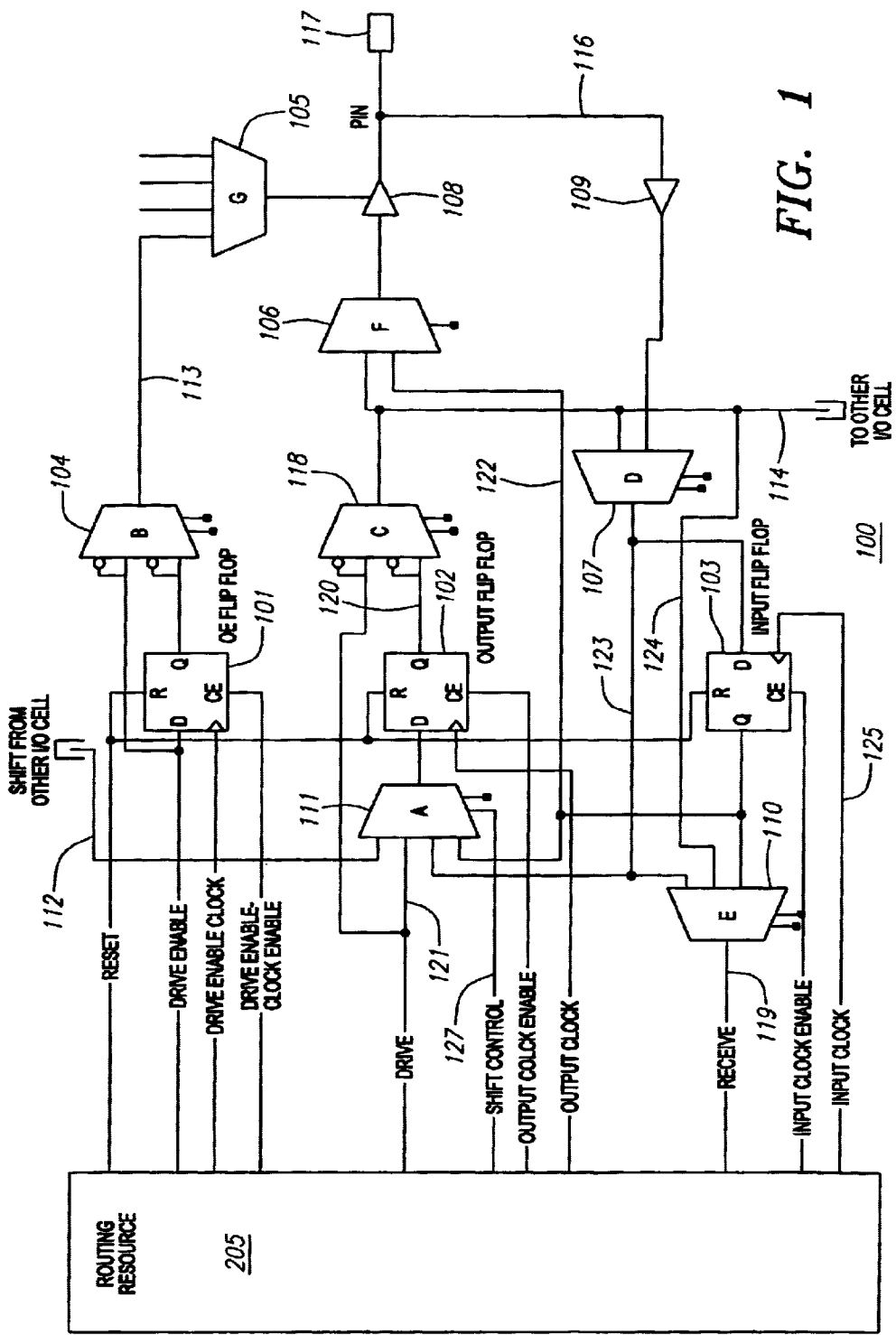
FIG. 1 shows, schematically, an input/output circuit or cell 100, according to one embodiment of the present invention.

FIG. 1 shows, schematically, an input/output (I/O) circuit or cell 100, according to one embodiment of the present invention. As shown in FIG. 1, output-enable (OE) flip-flop 101, output flip-flop 102 and input flip-flop 103 are provided in I/O circuit 100. I/O circuit 100 receives data signal (e.g., data signal "drive" at terminal 121) and a number of control signals (e.g., "input clock" signal at terminal 115) from routing resource 205. Multiplexer 104 ("B") selects an OE signal between the registered output of OE flip-flop 101 and its complement, and an unregistered OE control signal from a source within the programmable logic circuit outside of I/O cell 100 and its complement. The selected signal of multiplexer 104 is output at terminal 113, and is selectable by multiplexer 105 ("G") to control tristate buffer 108. Multiplexer 105 can also render tristate buffer 108 always "on" or always "off" by selecting a "1" value or "0" value, respectively, as indicated in FIG. 1. Tristate buffer 108 drives pin 117 of the programmable logic circuit.

Output flip-flop 102 receives an output signal from multiplexer 111 ("A"), which receives the signal at terminal 112 from a neighboring I/O cell, and a signal routed into I/O circuit 100 from terminal 121. A data signal received into I/O cell 100 can be routed (e.g., at terminal 119) to other parts of the programmable logic circuit via routing resource 205. Multiplexer 111 also selects between the registered and the unregistered output signals of multiplexer 107 ("D"). The value selected by multiplexer 111 is provided as an output value of output flip-flop 102 at terminal 120. Multiplexer 118 ("C") selects between this output value at terminal 120 (and its complement) and an input signal (and its complement) received from another portion of the programmable logic (e.g., from an global routing pool) to provide an output value at terminal 114. Terminal 114 is coupled to terminal 112 of a neighboring I/O circuit, so that terminal 112, multiplexer 111, output flip-flop 102, multiplexer 118 and terminal 114 forms a serial shift path through I/O circuit 100. Multiplexer 106 ("F") selects between the signal at terminal 114 and the registered output of input flip-flop 103 to provide a signal to be driven by tristate buffer 108 out of pin 117.

When I/O circuit 100 is configured to receive an input signal at pin 117 under an input or a bidirectional mode, input buffer 109 provides the input signal to multiplexer 107, which can also select the signal at terminal 114. The output value of multiplexer 107 is provided to input flip-flop 103. Multiplexer 110 ("E") selects between the output value of input flip-flop 103 (i.e., the registered value of the output value of multiplexer 107), the unregistered output value of multiplexer 107 and the value at terminal 114 to provide a signal at terminal 119, which can be routed outside of I/O cell 100 as a logic signal to any part of the programmable logic circuit. Various reset signal, clock signals and other control signals are also provided to I/O circuit 100, as shown in FIG. 1.

I/O cell 100 can be configured to be used for input, output, bidirectional, serial-to-parallel, parallel-to-serial, and shift register operations. Under input mode and bidirectional mode, the input signal can be received into the programmable logic circuit unregistered, and made registered by input flip-flop 103. Similarly, under output mode and bidirectional mode, the output signal can be output on pin 117 registered or unregistered. In addition, as described above, the output enable signal applied to output buffer 108 for driving a signal onto pin 117 can also be registered or unregistered. The serial-to-parallel and the parallel-to-serial operations can be double-buffered (i.e., delayed by two clock periods). The values of various control signals into the selection terminals of multiplexers 104–107, 118 and 110–111 for operating under each of these modes are summarized in FIG. 2.

Figure 3:
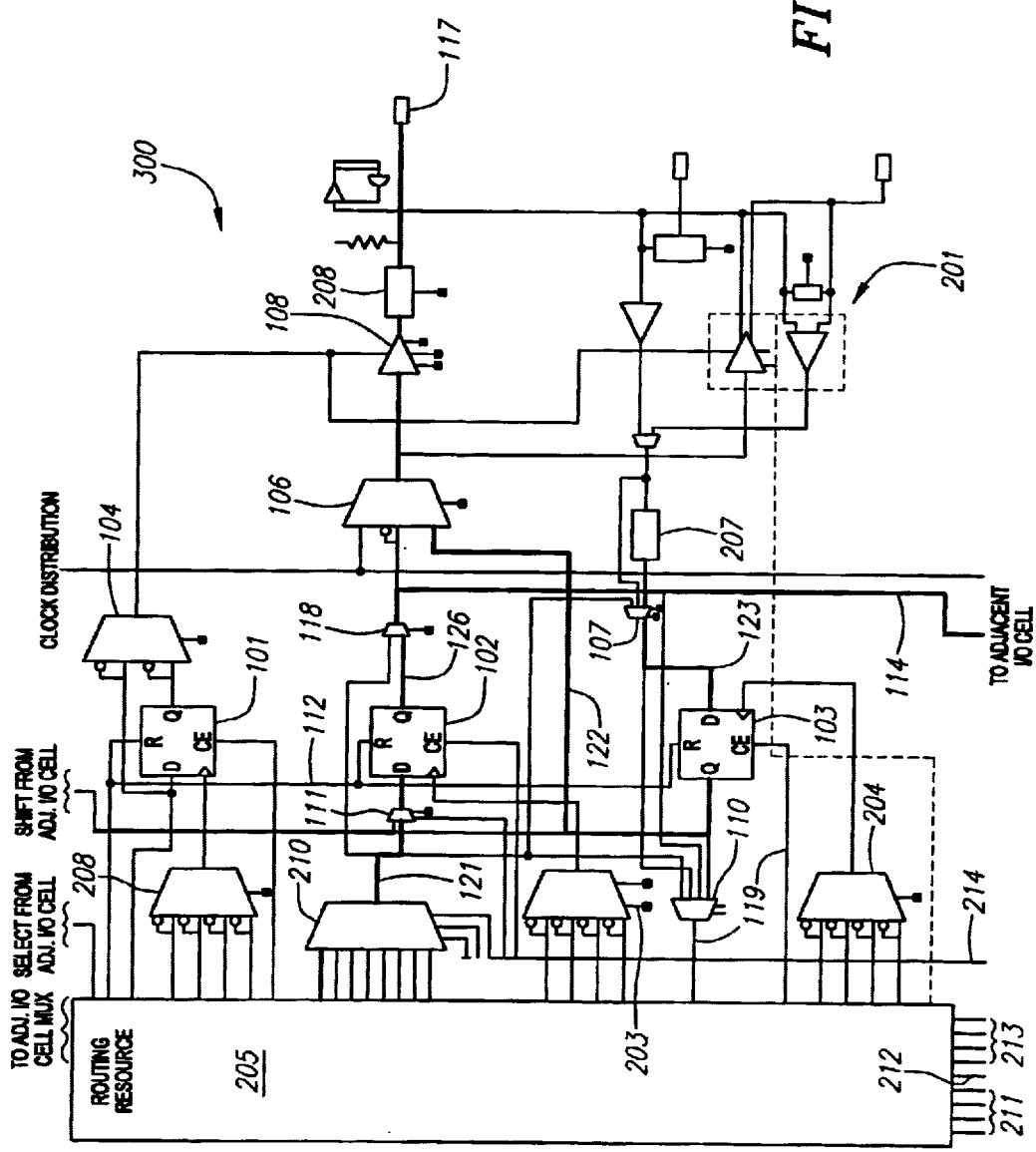
FIG. 3 illustrates the various serial-to-parallel modes of I/O cell 100 in implementation 300, according to one embodiment of the present invention.

FIG. 3 illustrates the various serial-to-parallel modes of I/O cell 100 in implementation 300, according to one embodiment of the present invention. In implementation 300, routing resource 205 is provided for routing signals into and out of I/O cell 100. As shown, routing resource 205 includes clock bus portion 211 for routing four global clock signals, reset portion 212 for routing a global reset signal, adjacent I/O portion 213 for routing 4 signals from adjacent I/O circuits, and select portion 214 for routing two common selection signals for controlling multiplexer 210, which provides the signal at terminal 121. Multiplexer 210 selects one of the four signals routed from neighboring I/O cells and the four signals from elsewhere in the programmable logic circuit (e.g., from a global routing pool).

Implementation 300 accepts a number of different input voltages at the pins, under multiple input voltage standards. As shown in FIG. 3, level converter circuit 201 provides signal level conversion for the input signal received at multiplexer 107. Various programmable termination circuits and programmable delay circuits are provided to adjust signal quality and noise immunity, as are known in the art. In implementation 300, multiplexers 202–204 each select one of a multiplicity of clock signals to a respective one of flip-flops 101–103. In a serial-to-parallel operation, serial input data are provided on line 301, which is latched one bit at a time into output flip-flop 102. In single buffer mode, the output value of output flip-flop 102 is provided to pin 117 through multiplexers 118, 106 and tristate buffer 108. As data is shifted out of output flip-flop 102 onto terminal 114 through multiplexer 118, the data is captured into output flip-flop 102 of an adjacent I/O cell from the corresponding shift-in terminal 112. Under double-buffer mode, rather than providing pin 117 the output value of multiplexer 118, input flip-flop 103 captures the value at terminal 114 (selected by multiplexer 107) and provides an output value, one clock period later, at terminal 122. Under double-buffer mode, multiplexer 106 provides the value at terminal 122 as parallel output data at pin 117.

Figure 4:
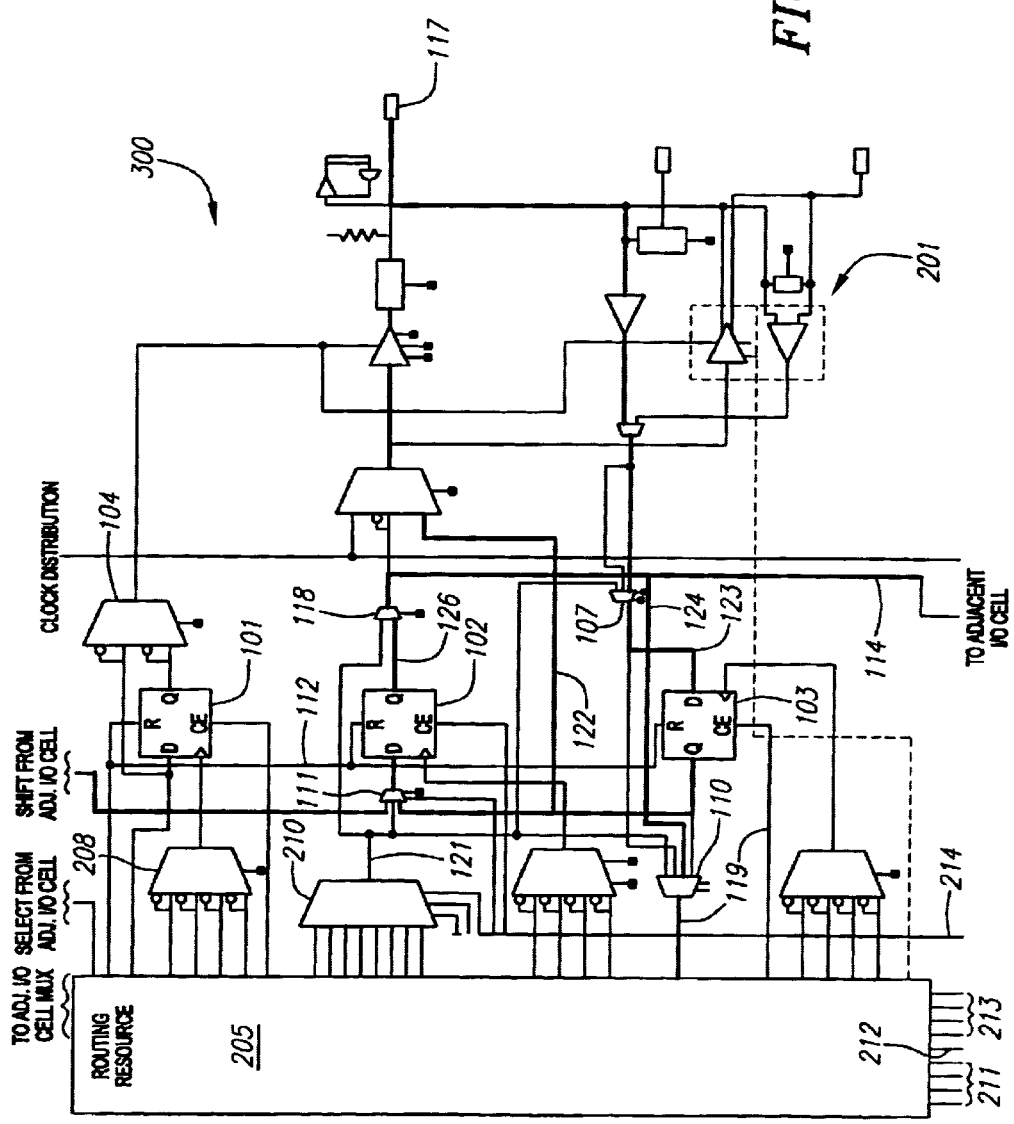
FIG. 4 illustrates the various parallel-to-serial modes of I/O cell 100 in implementation 300, according to one embodiment of the present invention.

FIG. 4 illustrates the various parallel-to-serial modes of I/O cell 100 in implementation 300, according to one embodiment of the present invention. In a parallel-to-serial operation, the parallel data are provided on the respective input pins of a number of I/O circuits. Each bit of the parallel data is selected by multiplexer 107 of each I/O circuit and latched into input flip-flop 103 of each I/O circuit from terminal 123. The value captured in input flip-flop 103 is captured by output flip-flop 102 in the next clock period. Multiplexer 111 coupled to the data input terminal of flip-flip 102 can be dynamically switched to facilitate a load or shift function by changing the control signal 127 from routing resource 205. The data in output flip-flop 102 is then shifted from I/O circuit to I/O circuit along the serial path formed by terminals 114 and 112 in each I/O circuit. Under single buffer mode, the output value of the last output flip-flop 102 is routed through terminal 124 as serial output at terminal 119. Under double-buffer mode, rather than routing the output signal through terminal 124, input flip-flop 103 of the last I/O circuit captures the value at terminal 114 and provides an output value, one clock period later, at terminal 122. Under double-buffer mode, multiplexer 110 provides the value at terminal 122 as serial output.

The above detailed description is provided to illustrate the embodiments of the present invention and is not intended to be limiting. Numerous variations and modifications within the scope of the present invention are possible. The present invention is set forth in the accompanying claims.

What is claimed is:

1. An I/O circuit for use in conjunction with a pin of an integrated circuit, comprising:

a first buffer providing a first output signal on said pin;

a second buffer receiving a first input signal from said pin;

a first terminal coupled to receive a second input signal from a first neighboring I/O circuit;

a second terminal coupled to provide a second output signal to a second neighboring I/O circuit;

a first multiplexer selecting from a first group of signals to provide a first data signal, said first group of signals including said second input signal;

a first flip-flop receiving said first data signal to provide an output value to be output by said first buffer as said first output signal and to be output at said second terminal as said second output signal;

a second multiplexer selecting from a second group of signals to provide a second data signal, said second group of signals including said first input signal and said second output signal; and a second flip-flop receiving said second data signal to provide a received data signal, said received data signal being included in said first group of signals.

2. The I/O circuit as in claim 1, further comprising a third multiplexer receiving said received data signal, said second output signal, and said first output signal to provide a third output signal.

3. The I/O circuit as in claim 2, further comprising a routing resource, said routing resource routing said third output signal to another I/O circuit.

4. The I/O circuit as in claim 3, said routing resource routing global clock signals among I/O circuits.

5. The I/O circuit as in claim 1, further comprising additional terminals for receiving additional multiple data signals from the routing resource.

6. The I/O circuit as in claim 1, further comprising a fourth multiplexer for selecting an output enable signal for said first buffer.

7. The I/O circuit as in claim 6, further comprising a third flip-flop for providing registering the output enable signal.

8. The I/O circuit as in claim 1, wherein said first multiplexer is configured to couple said first flip-flop and said second flip-flop in series to provide a double-buffered operation.

9. The I/O circuit as in claim 1, wherein said second multiplexer is configured to couple said first flip-flop and said second flip-flop in series to provide a double-buffered operation.

10. An integrated circuit comprising:

a routing resource; and a plurality of input/output (I/O) circuits coupled to the routing resource and to each other, each I/O circuit in the plurality of I/O circuits being configurable (i) in a first operation mode, to form an input circuit that provides bits serially from a pin of the integrated circuit to a terminal of the routing resource; (ii) in a second operation mode, to form an output circuit that provides bits serially from a terminal of the routing resource to a pin of the integrated circuit; (iii) in a third operating mode, to form with the remaining I/O circuits in the plurality a serial-to-parallel shift register that receives bits serially from a single terminal of the routing resource and provides the bits in parallel to pins of the integrated circuit, the serial-to-parallel shift register formed entirely within the plurality of I/O circuit; and (iv) in a fourth operating mode, to form with the remaining I/O circuits in the plurality a parallel-to-serial shift register that receives bits in parallel from pins of the integrated circuit and provides the bits serially to a single terminal of the routing resource, the parallel-to-serial shift register formed entirely within the plurality of I/O circuits, wherein the serial-to-parallel shift register is configurable for double buffered operation.

11. The integrated circuit as in claim 10 wherein the parallel-to-serial register is configurable for double buffered operation.

12. The integrated circuit as in claim 11 wherein the integrated circuit is a programmable interconnect circuit.

13. An integrated circuit comprising:

a routing resource; and a plurality of I/O circuits coupled between the routing resource, each comprising:

a pin;

an output flip-flop coupled at its output terminal to the pin;

an input flip-flop coupled at its output terminal to the routing resource; and a first multiplexer coupled at its input terminals to the output terminal of the output flip-flop and to the pin and at its output terminal to an input terminal of the input flip-flop, the first multiplexer operable to select between signals from the output flip-flop and the pin and to transmit the selected signal to the input flip-flop.

14. The integrated circuit of claim 13 including a second multiplexer coupled at its input terminals to the output terminals of the output flip-flop and input flip-flop and at its output terminal to pin, the second multiplexer operable to select between signals from the output flip-flop and the input flip-flop and to transmit the selected signal to the pin.

15. The integrated circuit of claim 13 including a second multiplexer coupled at its input terminals to the output terminal of the input flip-flop, the routing resource, and a signal path from an adjacent I/O circuit and at its output terminal to an input terminal of the output flip-flop, the second multiplexer operable to select between signals from the input flip-flop, the routing resource and the data path and to transmit the selected signal to the output flip-flop.

16. An integrated circuit comprising:

a routing resource; and a plurality of I/O circuits coupled between the routing resource, each comprising:

a pin;

an output flip-flop coupled at its output terminal to the pin;

an input flip-flop coupled at its output terminal to the routing resource;

a first multiplexer coupled at its input terminals to the output terminal of the output flip-flop and to the pin and at its output terminal to an input terminal of the input flip-flop, the first multiplexer operable to select between signals from the output flip-flop and the pin and to transmit the selected signal to the input flip-flop a second multiplexer coupled at its input terminals to the output terminals of the output flip-flop and input flip-flop and at its output terminal to pin, the second multiplexer operable to select between signals from the output flip-flop and the input flip-flop and to transmit the selected signal to the pin; and a third multiplexer coupled at its input terminals to the output terminal of the input flip-flop, the routing resource, and a signal path from an adjacent I/O circuit and at its output terminal to an input terminal of the output flip-flop, third multiplexer operable to select between signals from the input flip-flop, the routing resource and the data path and to transmit the selected signal to the output flip-flop.

* * * * *